United States Patent [19]

Miyamoto

[11] Patent Number: 5,171,398
[45] Date of Patent: Dec. 15, 1992

[54] EQUIPMENT FOR STICKING ADHESIVE TAPE ON SEMICONDUCTOR WAFER

[75] Inventor: Naoki Miyamoto, Tokyo, Japan
[73] Assignee: NEC Corporation, Tokyo, Japan
[21] Appl. No.: 600,439
[22] Filed: Oct. 19, 1990
[30] Foreign Application Priority Data
    Oct. 20, 1989 [JP] Japan .................. 1-272884
[51] Int. Cl.⁵ .................................... B32B 31/04
[52] U.S. Cl. ........................... 156/552; 269/21; 279/3
[58] Field of Search .......... 156/391, 538, 552; 269/21; 279/3; 355/87, 91

[56] References Cited

U.S. PATENT DOCUMENTS

| 3,955,163 | 5/1976 | Novak | 279/3 X |
| 4,603,466 | 8/1986 | Morley | 279/3 X |
| 5,033,538 | 7/1991 | Wagner et al. | 269/21 X |

FOREIGN PATENT DOCUMENTS

| 256952 | 5/1988 | Fed. Rep. of Germany | 269/21 |
| 62-287639 | 12/1987 | Japan . | |
| 63-166243 | 7/1988 | Japan . | |

*Primary Examiner*—David A. Simmons
*Assistant Examiner*—Mark A. Osele
*Attorney, Agent, or Firm*—Laff, Whitesel, Conte & Saret

[57] ABSTRACT

Disclosed herein is an equipment for sticking a vinyl tape on the backside surface of a wafer prior to the dicing of the wafer. Suction ports for sucking and supporting the peripheral part of the wafer surface is provided in the outer block of a stage for supporting the wafer, a recessed part is formed at the central part of the support stage so as to avoid the contact of the central part of the wafer to the support stage, and concentric ring-shaped projection parts are formed on the bottom surface of the recessed part. The height of the top face of the ring-shaped projection parts is set to be slightly lower than the outer block of the support stage which is the wafer contact part, with minute gaps being kept from the fixed wafer. It is possible to prevent the generation of flexure due to a turning roller at the time of sticking of the tape by introducing high pressure air to the recessed part of the wafer support part and the minute gaps.

10 Claims, 4 Drawing Sheets

EQUIPMENT FOR STICKING ADHESIVE TAPE ON SEMICONDUCTOR WAFER

BACKGROUND OF THE INVENTION

1. Field of the Invention

The present invention relates to an equipment used for manufacturing a semiconductor device and, more particularly, to an equipment for sticking an adhesive tape on a semiconductor wafer (referred to simply as a "wafer" hereinafter).

2. Description of the Prior Art

As well known in the art, one wafer contains a number of semiconductor chips (or pellets or dice) and hence the wafer is required to be diced to obtain individual semiconductor chips. At this time, in order to prevent the individual chips from being scattered, the wafer is stuck with an adhesive tape or sheet made of, for example, vinyl chloride and then diced into the individual chips. An equipment for sticking an adhesive tape of a wafer (called hereinafter "tape sticking equipment") is thus required.

A conventional tape sticking equipment includes a wafer support stage having a uniformly flat surface on which a semiconductor wafer is placed with a front side thereof being in contact with the support stage. The front side of the wafer contains a plurality of circuit elements such as transistors, resistors and so on. An adhesive tape is then stuck on the backside surface of the wafer by turning a roller with a pressure. Thus, the compressing force of the roller presses the whole front side of the wafer against the wafer support stage. Because of this, when the thickness of the wafer is nonuniform or when a slight unevenness exists on the surface of the wafer, stresses tend to concentrate locally on the wafer, so that there arise damages in the wafer itself or in the crystal structure of the wafer. Moreover, if there exists foreign materials on the surface of the support stage, the damage of the wafer is further enhanced, resulting in a substantial reduction in the yield.

In order to solve the above drawbacks, there is disclosed in Japanese Patent Laid Open No. 62-287639 and Japanese Patent Laid Open No. 63-166243 a tape sticking equipment in which a wafer support stage is constructed to have a recessed part to support only the peripheral part of a wafer and a gas is sent with a high pressure into a hollow portion formed between the recessed part of the wafer support stage and the wafer. In accordance with such an equipment, the major front side of the wafer is free from being in direct contact with the support stage. Moreover, the flexure in the wafer caused by the pressurization of the roller can be prevented by sending the gas with the pressure so as to cancel or counteract the pressure of the roller.

However, in that case, the pressure of the gas thus sent is applied to the entire surface of the wafer. Recently, the wafer is becoming large in the diameter and small in the thickness. For these reasons, when the roller is on the peripheral edge portion of the wafer, the balance in the pressure between the roller and the gas is destroyed and the latter pressure prevails over the former. As a result, the wafer is warped convexly to bring about a distortion in the crystal structure of the wafer. In the worst case, the wafer is broken.

In view of this, it is conceivable to vary the internal pressure of the hollow portion of the support stage in accordance with the position of the roller. To this end, however, it is required to detect the internal pressure and accordingly control the pressure of the gas to be sent, so that the tape sticking equipment is made complicated and expensive.

SUMMARY OF THE INVENTION

Therefore, it is an object of the present invention to provide an improved tape sticking equipment.

It is another object of the present invention to provide a tape sticking equipment with a simplified constitution which enables a satisfactory sticking of an adhesive tape to a wafer without causing damages or internal distortion to the wafer.

A tape sticking equipment for a wafer according to the present invention includes a wafer support stage with a recessed structure for supporting a wafer by making contact only with the peripheral edge part of the wafer and at least one ring-shaped projection part is provided within the recessed part. The height of the projection part is designed to make a minute gap between the wafer and the tip end of the projection part. Namely, the projection part has a height slightly lower than the peripheral portion of the support stage, which portion is in contact with the peripheral edge part of the wafer to support the wafer. A gas is made to flow with a predetermined pressure through the gap between the wafer and the tip end of the projection part. This gas may be introduced from the outside of the stage into the recessed part thereof through a duct provided on the bottom portion of the stage inside the projection part and may be exhausted through one or more ducts provided on the bottom portion of the stage outside the projection part. The wafer supported on the stage may be fixed thereto by sucking by use of vacuum suction ports provided in the peripheral portion of the stage.

As the gas flows through the gaps between the wafer and the ring-shaped projection, the pressure of the gas in the gap is increased. This pressure can be raised up to a level that counteracts the pressure applied to the wafer by the tape sticking. Accordingly, an adhesive tape is stuck on the wafer with the major surface of the wafer being free from the stage and the projection and without a substantial warp of the wafer. Even when the wafer is bent somewhat due to the increase in the pressure of the tape sticking, the gap is made narrower proportionately and the pressure therein is raised further, so that the warp of the wafer is restricted to the minimum level. Moreover, the pressure in the gap for counteracting the pressure by the tape sticking is applied only to a limited part of the wafer, so that the convex bending of the wafer can be prevented.

Thus, damages, contamination or the like to the wafer can be made substantially prevented to enhance the fabrication yield and the reliability and the quality of the semiconductor chips. Further, a tape sticking with high adhesivity that leaves no bubbles between the tape and the wafer becomes available. Namely, it becomes easy to control the adhesive force to have small variability, so that semiconductor pellets, which are thereafter obtained by dicing, are free from damages, cracks or the like.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
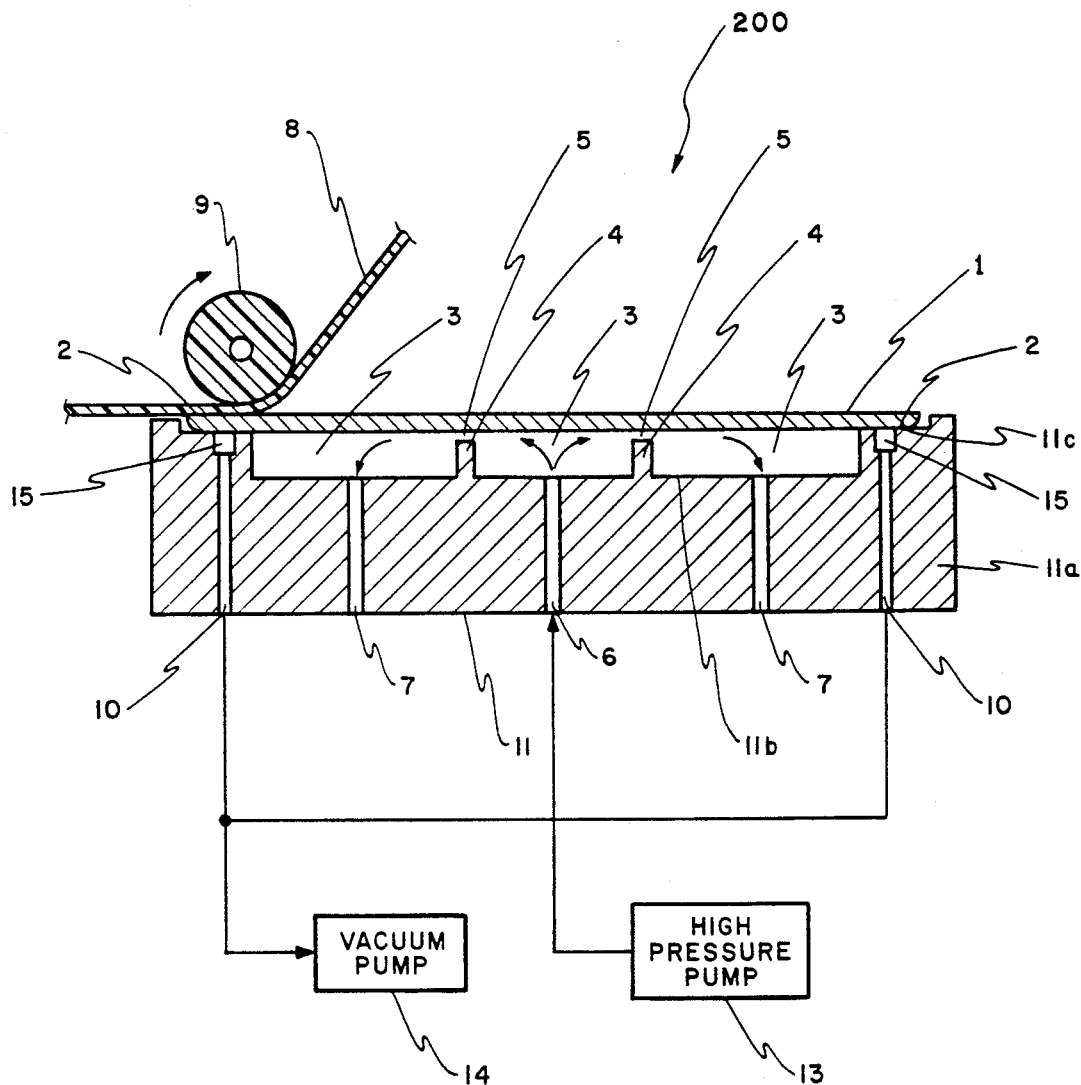
FIG. 1 is a vertical sectional view showing a tape sticking equipment according to an embodiment of the present invention.
Figure 2:
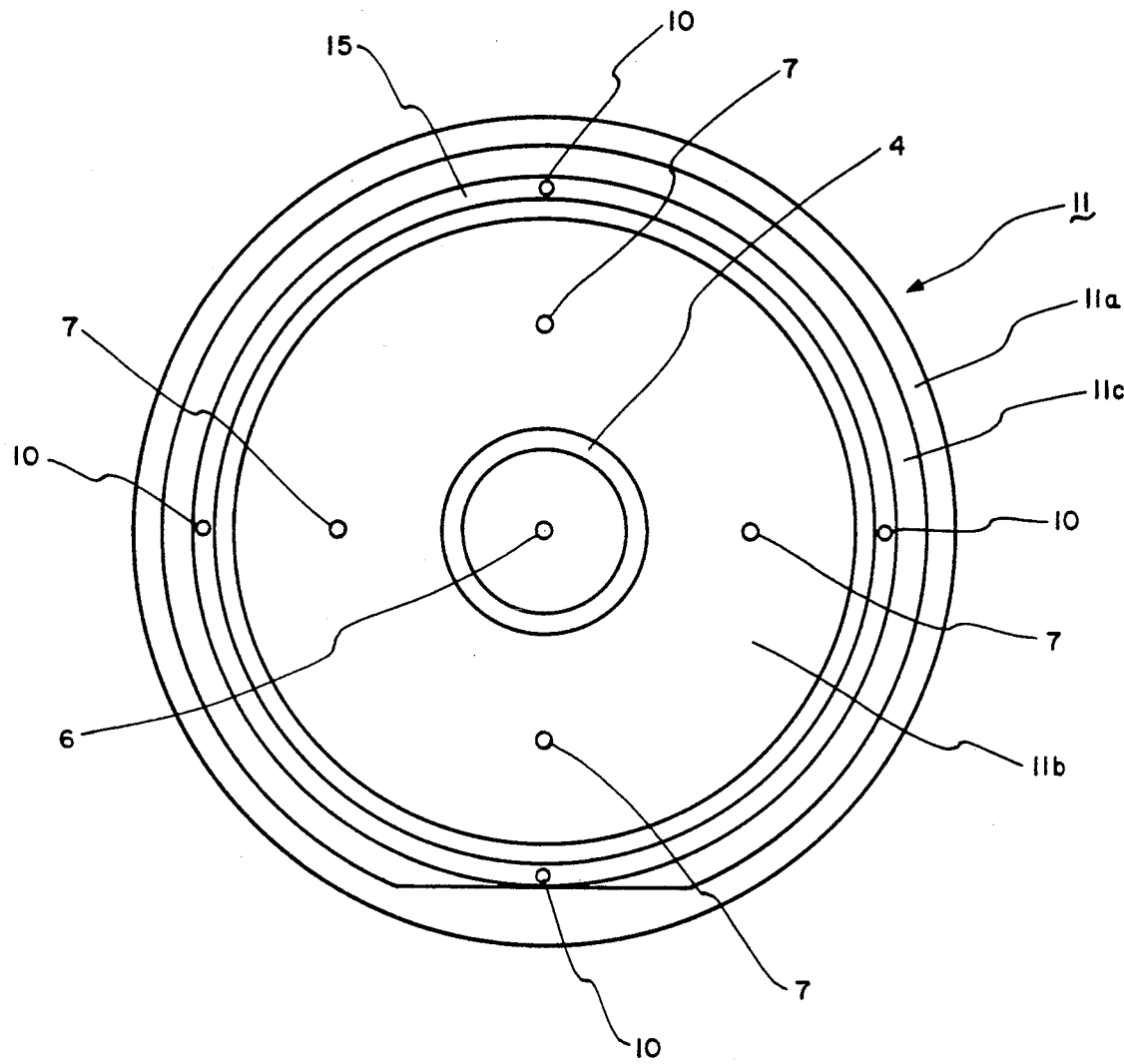
FIG. 2 is a plan view of the wafer support stage shown in FIG. 1.

Referring to FIG. 1 and FIG. 2, a tape sticking equipment 200 according to an embodiment of the present invention is designed to stick an adhesive tape 8 on a wafer 1 with 5-inch diameter. The tape 8 has a thickness of about 80 μm and is made of vinyl chloride. This equipment 200 includes a wafer support stage 11 having a circular recessed portion 11b with depth of about 3 mm at the central part excluding the outer peripheral block part 11a. The stage 11 thus supports a semiconductor wafer 1 such that the peripheral block part 11a thereof is in contact only with the peripheral part 2 of the wafer 1 with width of about 3 mm. The contact portion 11C between the wafer 1 and the stage 11 is thereby formed along the edge of the wafer 1. The recessed part 11b forms a hollow part 3 together with the wafer 1 that is fixed at the stage 11. At the position with a radial distance of 25 mm from the center of the recessed part 11b, there is provided a ring-shaped projection part 4 with a width of 1.5 mm. The height of the ring-shaped projection part 4 is set so as to maintain a minute gap 5 between the wafer 1 and the tip end of the ring-shaped projection part 4 when the wafer 1 is fixed to the stage 11.

A gas blowoff duct 6 is provided on the bottom surface of the recessed part 11b inside ring-shaped projection part 4 (at the center of the wafer support stage 11 in the present embodiment), and four exhaust ducts 7 are provided in the stage 11 outside the projection part 4. In addition, an annular groove 15 is provided along contact portion 11C of the wafer 1 and the stage 11, and four vacuum sucking ducts 10 are provided at the bottom of the groove. The gas blowoff duct 6 is connected to an external high pressure pump 13, which supplied a gas, air in this embodiment, to the duct 6 with a pressure controlled via a speed controller (not shown) so as to keep the flow rate constant. The gas exhaust ducts 7 are provided so as to directly connect the hollow part 3 of the wafer support stage 11 to the outside. The vacuum sucking ducts 10 are connected to a vacuum pump 14, and are evacuated so as to be able to fix the peripheral part 2 of the wafer 1 by sucking the part 2 to the wafer support stage 11.

The tape sticking to the wafer using the wafer support stage 11 as described in the above is performed by pressing the adhesive tape 8 by turning a roller 9 with a predetermined pressure. The turning roller 9 is of rod shape with diameter of about 40 mm, made of silicone resin. With the aforementioned structure it becomes possible at the time of tape sticking to enhance the adhesion of the tape while preventing the generation of micro bubbles due to entrainment of the air.

The projection part 4 within the recessed part 11b of the wafer support stage 11 is provided in order to eliminate the flexure of the wafer at the time of application of a pressure to the roller, which has been a problem in the conventional wafer support stage. That is, the air applied from the pump 13 flows through the duct 6 into the hollow area 3 inside of the projection part 4. The air thus introduced then passes the gap 5 between the wafer 1 and the ring-shaped projection part 4, and is discharged to the outside of the support stage 11 through the exhaust ducts 7. Since the flow rate and the pressure of the air from the pump 13 are kept constant, the air gains a speed as it passes the gap 5. Accordingly, the pressure within the gap 5 is raised by the Bernouilli's theorem up to a level that counteracts the pressure of the roller 9. In this manner, the wafer 1 is supported by the stage 11 not only at the peripheral edge thereof but also an internal portion thereof by the air gap 5. Accordingly, by turning the roller 9 so as to move on the wafer 1 from left to right, it is possible to stick the adhesive tape 8 on the wafer 1 without a substantial warp or bend of the wafer 1. In this embodiment, the gap 5 is designed to be 500 μm; the air applied by the high pressure pump 13 to the air blowoff duct 6 takes a gauge pressure of 1 Kg force/cm$^2$; and the roller 9 is turned with a pressure of 2±0.5 Kg force/cm$^2$. As a result, the tape 8 is stuck on the wafer 1 without generating substantial flexure of the wafer 1 and without substantial bubbles between the tape 8 and the wafer 1. Even if the central part of the wafer is bent downward by about 100 to 200 μm due to a increase in the pressurizing force of the roller 9, the pressure within the gap 5 is raised accordingly because of the narrowing of the gap 5, so that it is possible to suppress the flexure of the wafer to a possible minimum level.

In accordance with the structure of the present embodiment, the reaction of the air that pushes the wafer 1 upwardly will be increased acting to suppress the flexure of the wafer 1 in proportion to the degree of reduction in the spacing of the gap 5, so that it is possible to satisfactorily support the wafer at any pressurizing position of the roller 9. Moreover, since the supporting force for the wafer 1 acts not all over but only locally, warping of the wafer 1 will not arise in effect even when the roller 9 is located at a peripheral position as shown in FIG. 1. Accordingly, the wafer front face will never be brought into contact with the ring-shaped projection part 4. As in the above, according to the present embodiment, it is possible to provide a tape sticking equipment having an ideal support stage with a hollow structure that permits the peripheral part alone of the wafer to come into contact with and supports the central part of the wafer in noncontact fashion.

Figure 3:
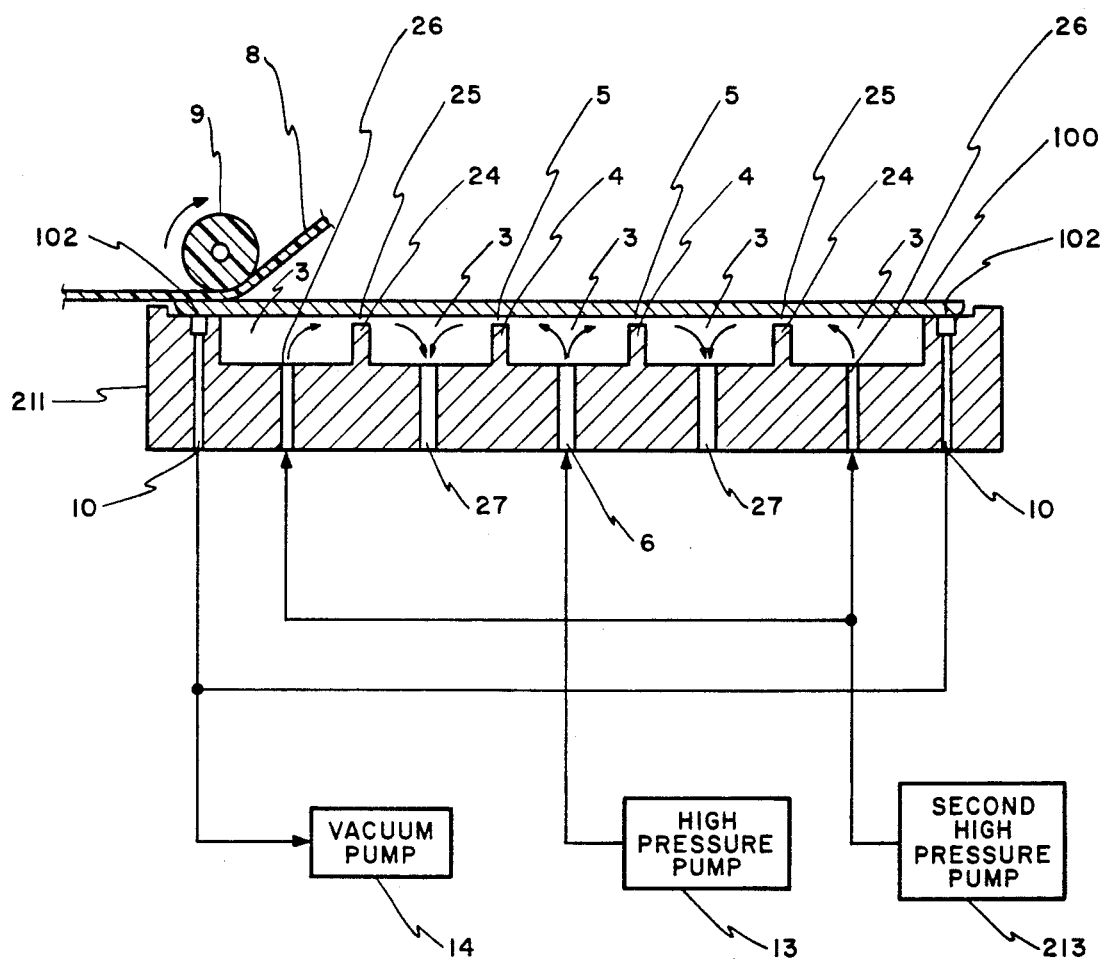
FIG. 3 is a vertical sectional view showing a tape sticking equipment according to another embodiment of the present invention.
Figure 4:
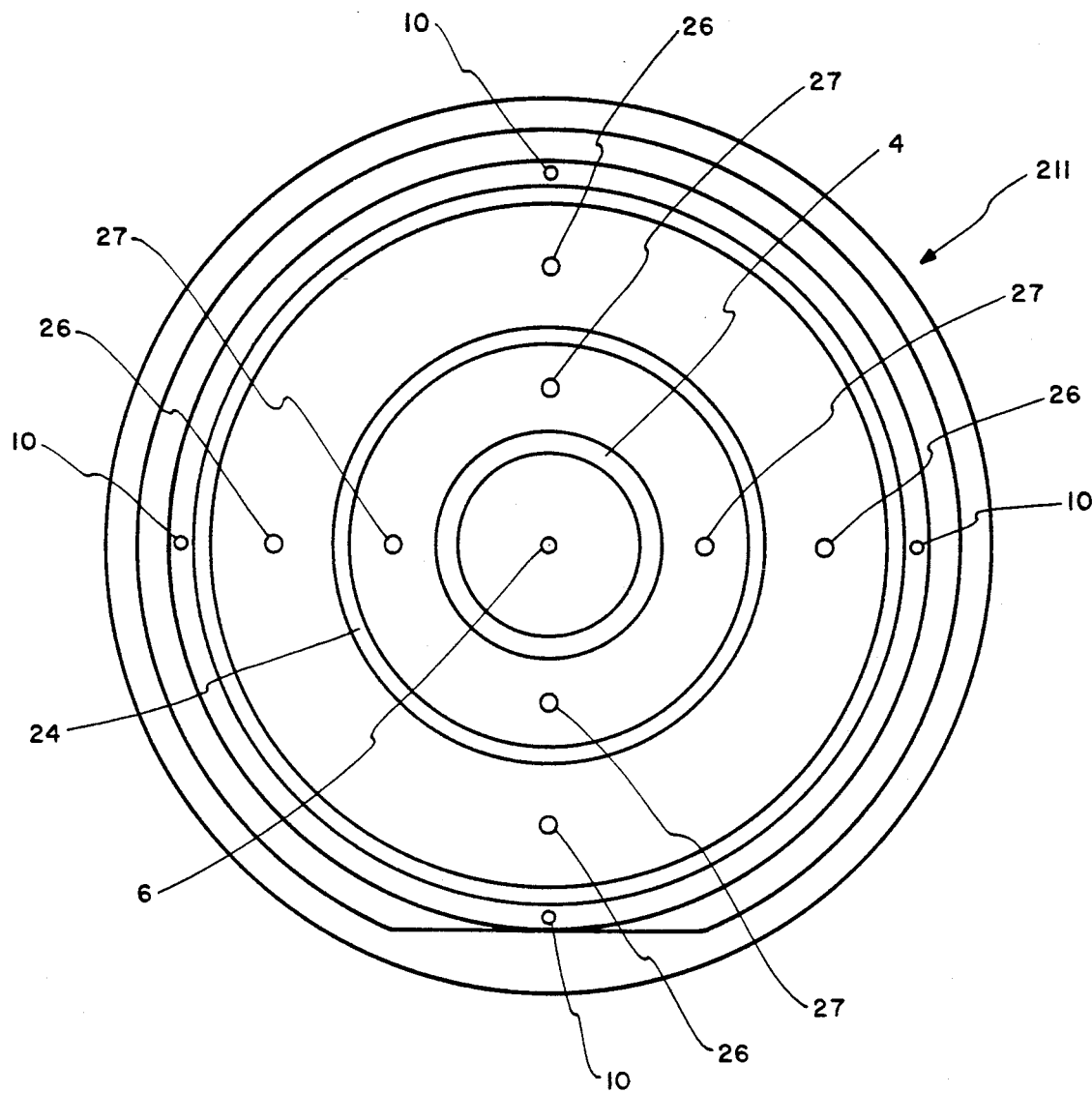
FIG. 4 is a plan view of the wafer support stage shown in FIG. 3.

Next, referring to FIG. 3 and FIG. 4, another embodiment of the present invention will be described. The tape sticking equipment of this embodiment is an example of application of the ring-shaped projection part 4 in FIG. 1 and FIG. 2 to the case tape sticking on a wafer with larger diameter without changing the formation position of the projection part 4. The central part of a wafer 100 is supported by high pressure air so as to suppress the generation of a flexure in the wafer. Since, however, the distance between the ring-shaped projection part 4 and the peripheral part 102 of the wafer 100 gets large, there is generated a flexure in the portion of the wafer between the ring-shaped projection part 4 and the wafer peripheral part 102 at the time of applying a pressure with the roller, thereby giving rise to the problem of entrainment of minute bubbles.

With the above in mind, the present embodiment is equipped anew with a second ring-shaped projection part 24 formed between the ring-shaped projection part 4 and the peripheral part 102 of the wafer 100 so as to form a gap 25 (for example, of 500 82 m) with the wafer 100 when the wafer 100 is fixed on a support stage 211, a total of four of second air blowoff ducts 26 provided on the outside of the second ring-shaped projection part 24, a second high pressure pump 213 connected to each of the second air blowoff ducts 26 so as to supply high pressure air of constant pressure and flow rate and a total of four of second air exhaust ducts 27 having a larger cross section in response to the flow of air supplied to the hollow part 3 from all of the air blowoff ducts 6 and 26.

With the above-mentioned construction, it is possible to satisfactorily support the portion of the wafer 100 in the vicinity of the second ring-shaped projection part 24 since the high pressure air with constant pressure and flow rate blowoff from the second air blowoff ducts 26 passes through the gap 25 between the second ring-shaped projection part 24 and the wafer 100. Even if that portion of the wafer develops a flexure at the time of applying a pressure with the roller, the reaction of the air to the wafer 100 is increased in proportion to the degree of narrowing of the gap 25, so that the wafer can be supported surely by the suppression of generation of a flexure in the wafer. As in the above, it is possible to provide a plurality of concentric ring-shaped projection parts corresponding to the magnitude of the wafer diameter.

It should be mentioned that in the wafer support stage 11 in FIG. 1 and FIG. 2 the high pressure pump that supplies high pressure air of constant pressure and a constant flow rate may be connected to both of the air exhaust ducts 7 and directly connect the hollow part 3 to the exterior of the wafer support stage 11 by keeping the air blowoff duct 6 open. Moreover, the cross sections and the number of the air blowoff duct 6 and the air exhaust ducts 7 in FIG. 1 and FIG. 2, and the second air blowoff ducts 26 and the second air exhaust ducts 27 in FIG. 3 and FIG. 4 may be determined corresponding to the flow rate of the air which is supplied to or discharged from the hollow part 3 of the wafer support stage.

Although the invention has been described with reference to specific embodiments, this description is not meant to be construed in a limiting sense. Various modifications of the disclosed embodiments, as well as other embodiments of the invention, may be made without departing from the scope and spirit of the invention. It is therefore contemplated that the appended claims will cover any modifications or embodiments as fall within the true scope of the invention.

What is claimed is:

1. An equipment for sticking an adhesive tape on a semiconductor wafer comprising:
    a wafer support stage having a peripheral part for supporting the peripheral part alone of a semiconductor wafer and a recessed part provided on the inside of the peripheral part of said wafer support stage;
    fixing means for fixing said semiconductor wafer on said peripheral part of said wafer support stage so as to cover said recessed part;
    at least one ring-shaped projection part provided in the recessed part of said wafer support stage so as to form a minute gap with the semiconductor wafer when said semiconductor wafer is fixed; and
    a turning roller for affixing an adhesive tape to the semiconductor wafer for dicing by applying a pressure to the tape,
    wherein a plurality of ducts for introducing a high pressur gas are provided on the bottom surface of the recessed part of said wafer support stage, a part of said ducts being provided on the radially inner side of said ring-shaped projection part while the rest being provided on the radially outer side thereof whereby high pressure gas may be introduced through the ducts in order to support the wafer above the minute gap.

2. The apparatus as claimed in claim 1, wherein said plurality of ducts comprise gas flow making means for both introducing said gas into said recessed part and for discharging said gas from said recessed part, said projection part being positioned between said introducing means and said discharging means.

3. The apparatus as claimed in claim 1, wherein a pump and said plurality of ducts comprises gas flow making means with at least one first gas duct provided on a bottom portion of said wafer support stage radially inside said projection part, at least one second gas duct provided on the bottom portion of said wafer support stage radially outside said projection part, and the pump supplying said gas to said hollow part through either of said first or second gas ducts.

4. The equipment as claimed in claim 2, wherein said wafer support stage includes a plurality of vacuum sucking ports provided in said peripheral side wall portion, said ports being connected to a vacuum pump.

5. The equipment as claimed in claim 2, wherein said gas is air.

6. The equipment as claimed in claim 1, wherein a plurality of said ring-shaped projection parts are provided concentric with the center of said recessed part.

7. The equipment as claimed in claim 1, wherein said wafer fixing means includes vacuum sucking ducts provided in the peripheral part of said wafer support stage of said wafer fixing means.

8. The equipment as claimed in claim 1, wherein an air blowoff duct for supplying high pressure air to the gaps between said semiconductor wafer and said ring-shaped projection parts is provided at the center of the recessed part of said wafer support stage.

9. The equipment as claimed in claim 8, wherein air exhaust ducts for discharging the high pressure air that passed through the gaps between said semiconductor wafer and the ring-shaped projection parts are provided on the bottom surface of the recessed part of said support stage on the outside of said ring-shaped projection parts.

10. The equipment as claimed in claim 1, wherein air blowoff ducts are provided on the bottom surface of the recessed part of said support stage on the outside of said ring-shaped projection parts, and air exhaust ducts are provided on the inside thereof.

* * * * *